United States Patent
Dadvand et al.

(10) Patent No.: US 10,692,830 B2
(45) Date of Patent: Jun. 23, 2020

(54) MULTILAYERS OF NICKEL ALLOYS AS DIFFUSION BARRIER LAYERS

(71) Applicant: TEXAS INSTRUMENTS INCORPORATED, Dallas, TX (US)

(72) Inventors: Nazila Dadvand, Richardson, TX (US); Christopher Daniel Manack, Flower Mound, TX (US); Salvatore Frank Pavone, Murphy, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/038,598

(22) Filed: Jul. 18, 2018

(65) Prior Publication Data

US 2019/0109109 A1  Apr. 11, 2019

Related U.S. Application Data

(60) Provisional application No. 62/611,432, filed on Dec. 28, 2017, provisional application No. 62/568,429, filed on Oct. 5, 2017.

(51) Int. Cl.
*H01L 23/00* (2006.01)

(52) U.S. Cl.
CPC .............. *H01L 24/13* (2013.01); *H01L 24/11* (2013.01); *H01L 2224/11462* (2013.01); *H01L 2224/13007* (2013.01); *H01L 2224/1308* (2013.01); *H01L 2224/1318* (2013.01); *H01L 2224/13021* (2013.01); *H01L 2224/13082* (2013.01); *H01L 2224/13083* (2013.01);
(Continued)

(58) Field of Classification Search
CPC . H01L 2224/13084; H01L 2224/13155; H01L 2224/1308; H01L 2224/1358–13584; Y10S 438/927; C22C 19/03
See application file for complete search history.

(56) References Cited

U.S. PATENT DOCUMENTS 8,293,643 B2    10/2012  Cabral, Jr. et al.
2006/0234489 A1  10/2006  Wang
(Continued)

FOREIGN PATENT DOCUMENTS

WO    2004004003 A1   1/2004

OTHER PUBLICATIONS

Tan, C.W. & Chia, Pay Ying & Haseeb, A. S. M. A. (2015). Study on electrodeposited Ni-Mo alloy barrier films for electronic interconnects. Proceedings of the IEEE/CPMT International Electronics Manufacturing Technology (Year: 2015).*
(Continued)

*Primary Examiner* — Charles D Garber
*Assistant Examiner* — Alia Sabur
(74) *Attorney, Agent, or Firm* — Dawn Jos; Charles A. Brill; Frank D. Cimino

(57) ABSTRACT

A structure for a semiconductor device includes a copper (Cu) layer and a first nickel (Ni) alloy layer with a Ni grain size $a_1$. The structure also includes a second Ni alloy layer with a Ni grain size $a_2$, wherein $a_1 < a_2$. The first Ni alloy layer is between the Cu layer and the second Ni alloy layer. The structure further includes a tin (Sn) layer. The second Ni alloy layer is between the first Ni alloy layer and the Sn layer.

14 Claims, 5 Drawing Sheets

(52) U.S. Cl.
CPC .............. *H01L 2224/13084* (2013.01); *H01L 2224/13111* (2013.01); *H01L 2224/13147* (2013.01); *H01L 2224/13155* (2013.01); *H01L 2224/13184* (2013.01); *H01L 2924/01057* (2013.01); *H01L 2924/01058* (2013.01)

(56) References Cited

U.S. PATENT DOCUMENTS

| | | | | |
|---|---|---|---|---|
| 2011/0042831 | A1* | 2/2011 | Berberich | H01L 24/05 257/779 |
| 2013/0015574 | A1* | 1/2013 | Patel | H01L 24/11 257/737 |
| 2013/0154089 | A1 | 6/2013 | Lee et al. | |
| 2015/0054174 | A1 | 2/2015 | Lo et al. | |
| 2015/0364423 | A1 | 12/2015 | Liu et al. | |
| 2017/0253008 | A1 | 9/2017 | Cahalen et al. | |

OTHER PUBLICATIONS

Rupert, Timothy & Schuh, Christopher. (2010). Sliding Wear of Nanocrystalline Ni-W: Structural Evolution and the Apparent Breakdown of Archard Scaling. Acta Materialia—ACTA MATER. 58. 4137-4148. 10.1016/j.actamat.2010.04.005 (Year: 2010).*

PCT International Search Report for International Application No. PCT/US 2018/054432, dated Jan. 31, 2019, 2 pages.

\* cited by examiner

US 10,692,830 B2

MULTILAYERS OF NICKEL ALLOYS AS DIFFUSION BARRIER LAYERS

CROSS-REFERENCE TO RELATED APPLICATION(S)

This application claims priority to U.S. Provisional Application No. 62/611,432, filed Dec. 28, 2017, and U.S. Provisional Application No. 62/568,429, filed Oct. 5, 2017, which are hereby incorporated by reference.

BACKGROUND

Wafer bumping is a requirement for board level semiconductor packaging whereby bumps or balls made of solder are formed on the wafers in a whole wafer prior to dicing of wafer into individual chips. The electromigration failure mode of bumps resulting from interdiffusion of copper (Cu) and tin (Sn) is a significant problem in semiconductor devices.

SUMMARY

In order to solve the above problem, it is desirable to provide a semiconductor device formed by electrodeposition of multilayers of nickel (Ni) alloys on Cu that is able to overcome the above disadvantage. Advantages of the present invention will become more fully apparent from the detailed description of the invention hereinbelow.

In one aspect of the disclosure, a structure for a semiconductor device includes a Cu layer and a first Ni alloy layer with a Ni grain size $a_1$. The structure also includes a second Ni alloy layer with a Ni grain size $a_2$, wherein $a_1<a_2$. The first Ni alloy layer is between the Cu layer and the second Ni alloy layer. The structure further includes a Sn layer or a Sn alloy such as Sn—Ag, Sn—Cu—Ag, Sn—Bi, etc. The second Ni alloy layer is between the first Ni alloy layer and the Sn layer.

In another aspect of the disclosure, an integrated circuit (IC) package includes a die and a bump electrically connected to the die. The bump includes a Cu layer and a first nickel tungsten (NiW) layer, with a Ni grain size $a_1$, formed over the Cu layer. The bump also includes a second NiW layer, with a Ni grain size $a_2$, formed over the first NiW layer. The bump further includes a third NiW layer, with a Ni grain size $a_3$, formed over the second NiW layer, wherein $a_1<a_2<a_3$. A Sn layer is formed over the third NiW layer.

In yet another aspect of the disclosure, a method of forming an integrated circuit package includes forming a die and forming a bump on the die such that the bump is electrically connected to the die. The forming of the bump includes forming a first Ni alloy layer, with a Ni grain size $a_1$, over a Cu layer. The forming of the bump also includes forming a second Ni alloy layer, with a Ni grain size $a_2$, over the first Ni alloy layer, wherein $a_1<a_2$. The forming of the bump further includes forming a Sn layer over the second Ni alloy layer.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Figure 1:
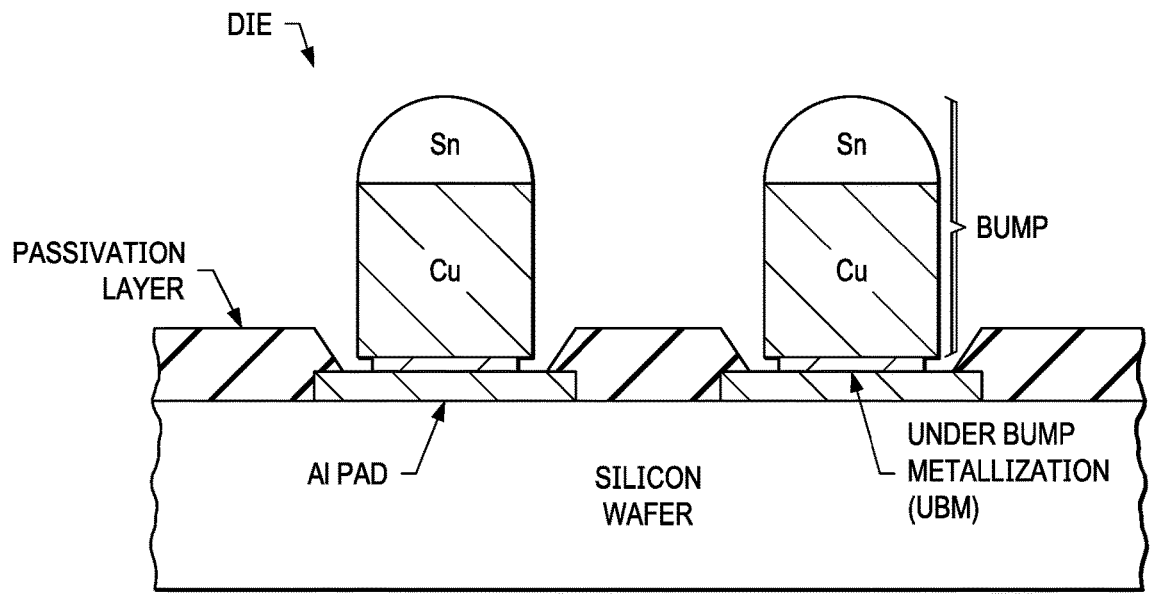
FIG. 1 is a side view of an IC package.

The increasing demand for miniaturization of semiconductor packages (or IC packages) necessitates the increased current density (amount of current per surface area) per bump. FIG. 1 displays a schematic diagram of an IC package with the bumps. Therefore, the electromigration failure mode of bumps is critical to determine the bump current carrying capability. Electromigration is the transport of material as a result of gradual movement of the ions in a conductor due to the momentum transfer between conducting electrons and diffusing metal atoms. Electromigration degrades the reliability of chips resulting in eventual loss of connections or failure of a circuit. The electromigration effect becomes more important with the reduction in the structure size in electronics such as ICs. Electromigration failure in Cu pillar bumps and also in solder bumps is attributed to the depletion of intermetallic compounds at the interface of Cu and Sn.

Both the growth of intermetallic compounds (IMCs) between Cu and Sn and void formation affect the solder joint reliability, which can degrade the mechanical and electrical properties of the joints. The mechanism of void formation in the Cu/Sn system is basically caused by unbalanced diffusion rates of Cu and Sn in which the diffusion rate of copper is higher than that of tin in the $Cu_3Sn$ phase (the Kirkendall effect). The Kirkendall effect is the motion of the interface between two metals that occurs as a result of the difference in diffusion rates of the metal atoms. The Kirkendall effect has important practical consequences. One of these is the prevention or suppression of voids formed at the boundary interface in various kinds of alloy-to-metal bonding. These are referred to as Kirkendall voids.

Voiding and micro-cracks elimination and/or reduction at the Cu—Sn interface can be achieved through insertion of multilayered (or multilayers of) NiW with controlled grain size. The Cu—Sn intermetallic layer is dominated by formation of $Cu_6Sn_5$ ($\eta$) phase and a limited amount of $Cu_3Sn$ ($\epsilon$) is formed as a non-continuous layer at the Cu surface. In general, the $\eta$-phase shows extensive scalloping with a pattern similar to the $\epsilon$-islands. The Kirkendall voids are usually present in the $Cu_3Sn$-phase mainly in the adjacent of the Cu—$Cu_3Sn$ interface and on the interface itself and the $Cu_3Sn$ layer grows at the expense of $Cu_6Sn_5$ as long as there is a sufficient source of Cu. Therefore, insertion of an intermediate diffusion barrier layer at the Cu—Sn interface can decrease and/or eliminate the inter-diffusion of Cu and Sn. When Ni alone has been used as a diffusion barrier layer, formation of brittle intermetallic compounds of $Ni_3Sn_4$ at the Sn and Ni interface occurs which imposes reliability issues. The presence of dissolved Cu into the $Ni_3Sn_4$ slows down the intermetallic growth. However, the amount of the Cu needs to be small enough to form $(Cu,Ni)3Sn4$. Presence of too much Cu results in formation of a Cu/Ni-intermetallic with the $Cu_6Sn_5$-stoichiometry resulting in extensive scalloping.

Pulsed Electrodeposition of multiple NiW layers with Controlled Grain Structure as a Diffusion Barrier Layer is the solution to these problems. Interfacing of NiW at the Cu and Sn interface through reversed pulse electrodeposition in which the Ni grain size of the electrode posited NiW may be precisely controlled by using a particular plating chemistry together with a reversed pulse waveform is disclosed. Using this reversed pulse plating, anodic and cathodic pulses or waveforms are mixed where cathodic pulses are followed by anodic pulses.

Application of multiple layers of NiW through electrodeposition in which the first layer 301 (see FIG. 4) has a grain size of $a_1$, a second layer 402 has a grain size of $a_2$, and, if employed, a third layer 403 has a grain size of $a_3$, where $a_1<a_2<a_3$. Some amount of the codeposited W is solubilized in crystal structure of Ni grain and the rest is segregated at the grain boundary of Ni. The content (% by weight) of the codeposited W (i.e., with respect to the entire NiW layer) is inversely related to the size of the grains. Therefore, through precise controlling of codeposited W, it is possible to control the grain size of Ni precisely. The amount of codeposited tungsten (W) depends on the type of the applied reversed pulse waveform; meaning that the cathodic and anodic current densities as well as their pulse duration influence the amount of codeposited tungsten. The content of codeposited tungsten influences the size of nickel (Ni) grains. Therefore, by precise controlling of the anodic and cathodic current densities and their pulse duration, it is possible to precisely control the grain size of nickel (Ni). The segregation of W at the grain boundary of Ni blocks the diffusion of the Cu through the grain boundary path. Also, Ni within the higher layer (as oriented in FIG. 4) having larger grain size would have a tendency to diffuse towards the layer with smaller grain size. Therefore, the Ni in the layer 403 will have tendency to diffuse towards layer 402 and the Ni in layer 402 would have a tendency to diffuse towards layer 401. This is expected to slow down or eliminate the Ni diffusion from layer 403 to the Sn layer due to its tendency for diffusion towards its under layer. On the other hand, it is expected that the segregated W at the Ni grain boundary would slow down or eliminate the formation of a brittle $Ni_3Sn_4$ intermetallic compound.

Insertion of multilayered NiW at the Cu—Sn interface solves the above problems. A multilayered deposition process is performed in which the NiW layers are deposited with gradually increasing Ni grain size starting from the Cu layer. This results in, inter alia, segregation of W at grain boundaries of Ni, thereby improving electromigration performance.

Reversed pulse electrodeposition slows down or eliminates the formation of a brittle $Ni_3Sn_4$ intermetallic layer that would otherwise be formed at the interface of Sn and Ni.

The segregation of W in the Ni grain boundary slows down or eliminates the diffusion of Cu through grain boundary paths resulting in a more efficient diffusion barrier compared to Ni alone.

The deposition of multilayered NiW with precise control of grain size allows enforcement of the direction of Ni diffusion to be towards the underlayer NiW layer having smaller grain size (i.e., in a direction toward the Cu layer). This results in slowing down or elimination of Ni diffusion towards the Sn layer, hence reducing the thickness of any possible-formed $Ni_3Sn_4$ intermetallic compound which is brittle in nature. On the other hand, the solid solubility of Ni in Cu would provide good adhesion at the first NiW layer 401 and the Cu layer 410 interface (FIG. 4).

Reversed pulse electrodeposition allows for adjustment of the Ni grain size hence enforcing the Ni diffusion more towards the underlayer NiW layer as compared to toward the Sn layer.

Reversed pulse electrodeposition allows precise control of the grain growth of Ni and the precise amount of segregated W. Reversed pulse electrodeposition also allows for electrodeposition of multiple layers of NiW with gradually increasing grain size of nickel during the plating resulting in enforcement of Ni diffusion towards its underlayer of NiW (e.g., towards the lower Ni alloy layers in FIGS. 2 and 3, or the lower NiW layers in FIG. 4) that has smaller Ni grain size.

Figure 2:
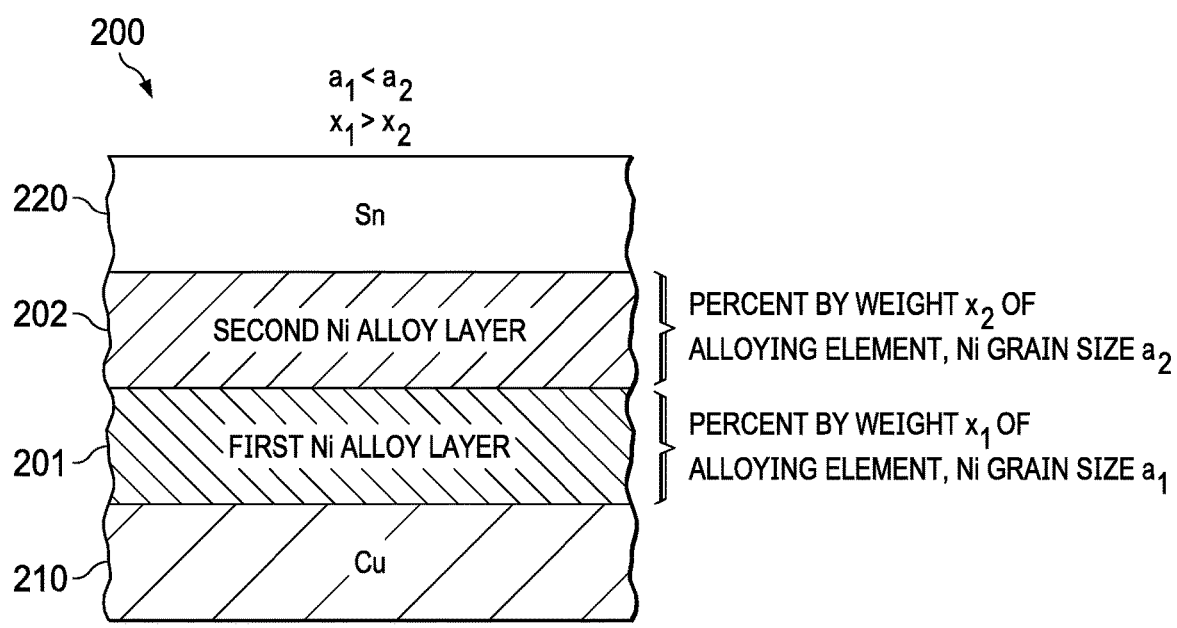
FIG. 2 is a side view of a multilayered structure of a bump, in accordance with this disclosure.
Figure 3:
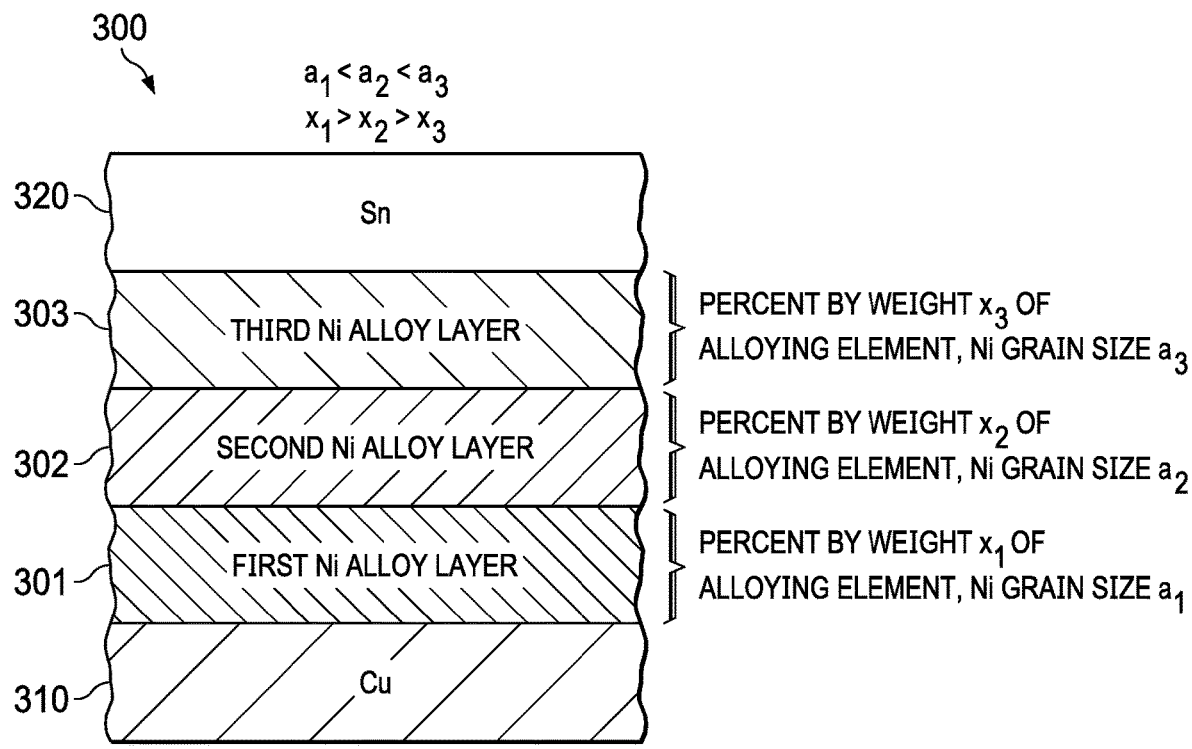
FIG. 3 is a side view of another multilayered structure of a bump, in accordance with this disclosure.
Figure 4:
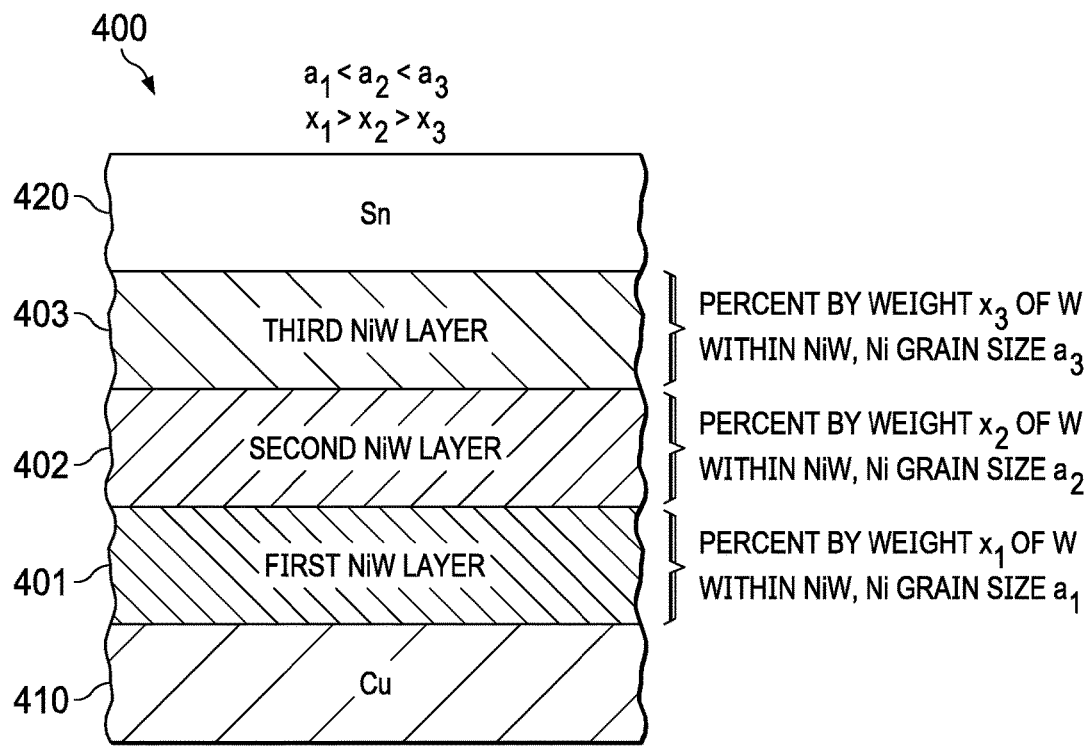
FIG. 4 is a side view of yet another multilayered structure of a bump, in accordance with this disclosure.

FIGS. 2-4 show, inter alia, a particular grain size arrangement within a multilayered structure of a bump.

With reference to FIG. 2, in one aspect of the disclosure, a structure 200 for a semiconductor device includes a Cu layer 210 and a first Ni alloy layer 201 with a Ni grain size $a_1$. The structure 200 also includes a second Ni alloy layer 202 with a Ni grain size $a_2$, wherein $a_1<a_2$. The first Ni alloy layer 201 is between the Cu layer 210 and the second Ni alloy layer 202. The structure 200 further includes a Sn layer 220. Sn layer 220 may optionally be comprised of a Sn alloy such as Sn—Ag, Sn—Cu—Ag, Sn—Bi, etc. The second Ni alloy layer 202 is between the first Ni alloy layer 201 and the Sn layer 220.

In an example, the first Ni alloy layer 201 and the second Ni alloy layer 202 each comprises at least one element selected from the group consisting of tungsten (W), molybdenum (Mo), an element from a lanthanoid group, and combinations thereof.

In an example, a % by weight ($x_1$) of the at least one element within the first Ni alloy layer 201 is present, a % by weight ($x_2$) of the at least one element within the second Ni alloy layer 202 is present, and wherein $x_1>x_2$.

In an example, the first Ni alloy layer 201 may be formed over the Cu layer 210, and the Sn layer 220 may be formed over the second Ni alloy layer 202.

In an example, some of the at least one element in the first Ni alloy layer 201 and some of the at least one element in the second Ni alloy layer 202 are solubilized in the Ni grains, while a remainder of the at least one element in the first Ni alloy layer 201 and a remainder of the at least one element in the second Ni alloy layer 202 are segregated at boundaries of the Ni grains.

In an example, the first Ni alloy layer 201 comprises NiW.

In an example, the second Ni alloy layer 202 comprises NiW.

In an example, the first Ni alloy layer 201 comprises NiCe, NiLa, NiMo, NiMoW, or NiWCe.

In an example, the second Ni alloy layer 202 comprises NiCe, NiLa, NiMo, NiMoW, or NiWCe.

With reference to FIG. 3, in another aspect of the disclosure, a structure 300 for a semiconductor device includes a Cu layer 310 and a first Ni alloy layer 301 with a Ni grain size $a_1$. The structure 300 also includes a second Ni alloy layer 302 with a Ni grain size $a_2$, wherein $a_1<a_2$. The first Ni alloy layer 301 is between the Cu layer 310 and the second Ni alloy layer 302. The structure 300 further includes a third Ni alloy layer 303 with a Ni grain size $a_3$, formed over the second Ni alloy layer 302, and a Sn layer 320 is formed over the third Ni alloy layer 303, wherein $a_1<a_2<a_3$.

In an example, the first Ni alloy layer 301, the second Ni alloy layer 302, and the third Ni alloy layer 303 each comprises at least one element selected from the group consisting of tungsten (W), molybdenum (Mo), an element from a lanthanoid group, and combinations thereof. A % by weight ($x_1$) of the at least one element within the first Ni alloy layer 301 is present, a % by weight ($x_2$) of the at least one element within the second Ni alloy layer 302 is present, a % by weight ($x_3$) of the at least one element within the third Ni alloy layer 303 is present, and wherein $x_1>x_2>x_3$.

With reference to FIG. 4, in another aspect of the disclosure, a structure 400 for a semiconductor device includes a Cu layer 410 and a first nickel tungsten (NiW) layer 401, with a Ni grain size $a_1$, formed over the Cu layer 410. The structure 400 also includes a second NiW layer 402, with a Ni grain size $a_2$, formed over the first NiW layer 401. The structure 400 further includes a third NiW layer 403, with a Ni grain size $a_3$, formed over the second NiW layer 402, wherein $a_1<a_2<a_3$. A Sn layer 420 is formed over the third NiW layer 403.

Figure 5:
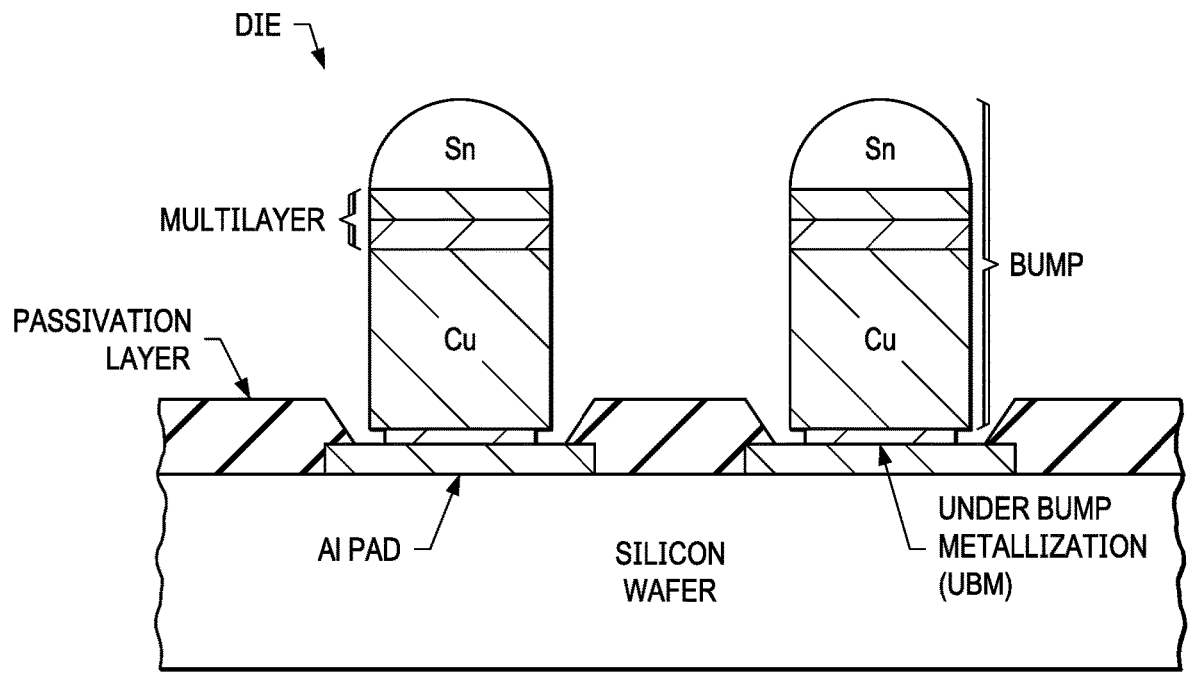
FIG. 5 is a side view of an IC package including a multilayered bump structure, in accordance with this disclosure.

With reference to FIG. 5, in another aspect of the disclosure, an IC package/die includes a multilayered bump (also shown in FIG. 4). With specific reference back to FIG. 4, the multilayered bump 400 includes a Cu layer 410 and a first nickel tungsten (NiW) layer 401, with a Ni grain size $a_1$, formed over the Cu layer 410. The bump 400 also includes a second NiW layer 402, with a Ni grain size $a_2$, formed over the first NiW layer 401. The bump 400 further includes a third NiW layer 403, with a Ni grain size $a_3$, formed over the second NiW layer 402, wherein $a_1<a_2<a_3$. A Sn layer 420 is formed over the third NiW layer 403.

In an example, a % by weight ($x_1$) of the W within the first NiW layer 401 is present, a % by weight ($x_2$) of the W within the second NiW layer 402 is present, and a % by weight ($x_3$) of the W within the third NiW layer 403 is present, and wherein $x_1>x_2>x_3$.

In an example, the first NiW layer 401 and/or the second NiW layer 402 comprise an element from a lanthanoid group.

In an example, some W in the first NiW layer 401, second NiW layer 402, and third NiW layer 403 is solubilized in the Ni grains, while the remainder of the W in the first NiW layer 401, second NiW layer 402, and third NiW layer 403 is segregated at boundaries of the Ni grains.

Figure 7:
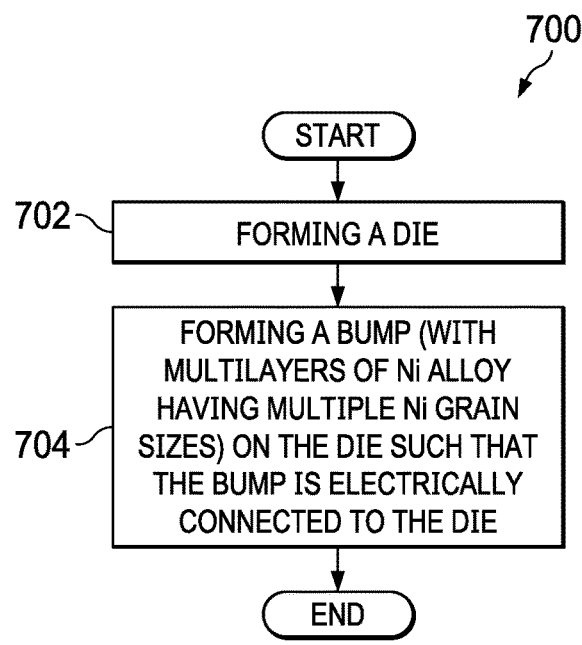
FIG. 7 is a flowchart illustrating an exemplary method for forming an integrated circuit package, in accordance with this disclosure.

With reference to FIG. 7, In yet another aspect of the disclosure, a method 700 of forming an integrated circuit package includes forming a die (block 702) and forming a bump on the die such that the bump is electrically connected to the die (block 704). The forming of the bump includes forming a first Ni alloy layer, with a Ni grain size $a_1$, over a Cu layer. The forming of the bump also includes forming a second Ni alloy layer, with a Ni grain size $a_2$, over the first Ni alloy layer, wherein a1<a2. The forming of the bump further includes forming a Sn layer over the second Ni alloy layer.

In an example of the method, the first Ni alloy layer and the second Ni alloy layer each comprises at least one element selected from the group consisting of tungsten (W), molybdenum (Mo), an element from a lanthanoid group, and combinations thereof.

In an example of the method, a % by weight ($x_1$) of the at least one element within the first Ni alloy layer is present, a % by weight ($x_2$) of the at least one element within the second Ni alloy layer is present, and wherein $x_1>x_2$.

In an example of the method, the forming of the first Ni alloy layer and the second Ni alloy layer are performed via a reversed pulse electrodeposition process.

In an optional process step (and with reference to FIGS. 8 and 9), once the multiple Ni alloy layers are formed, and before the Sn layer is formed thereon, the structure may be heated to a temperature between about 100-200° C. for a period of about 4-5 hours. This optional process step would melt or fuse the multiple Ni alloy layers together, thereby forming a single Ni alloy layer. This single Ni alloy layer, as a whole, would effectively have substantially similar properties (e.g., the location and distribution of the Ni grain sizes and W content % by weight) as those of the multiple Ni alloy layers. The resultant structure is shown in FIG. 8.

Figure 8:
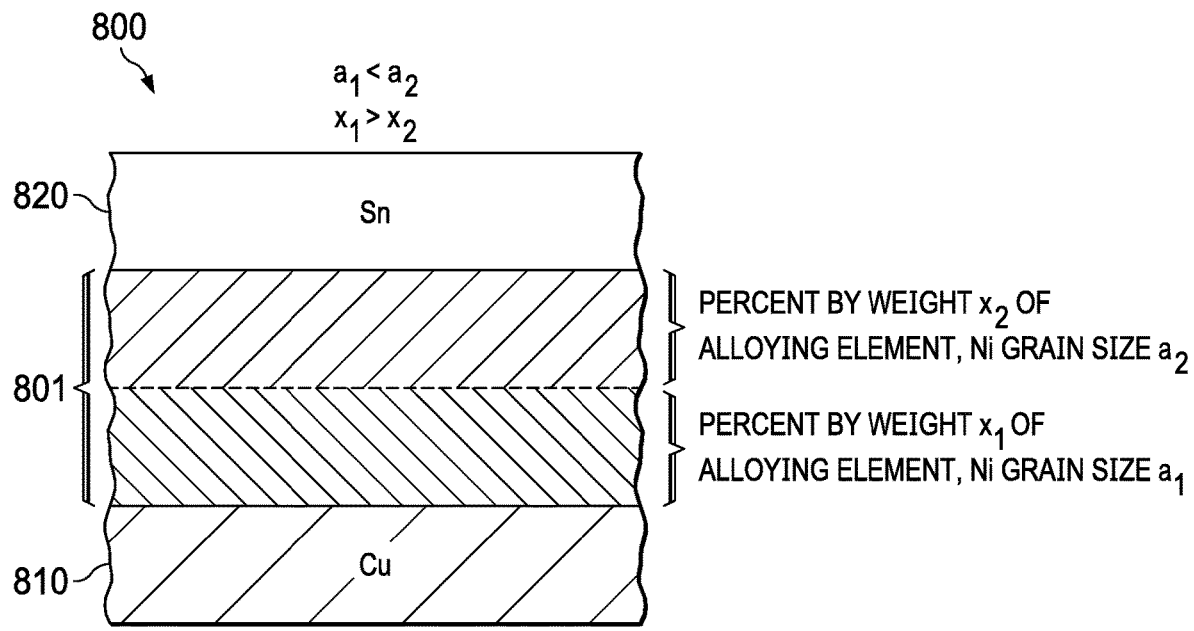
FIG. 8 is a side view of yet another multilayered structure of a bump, in accordance with this disclosure.

With reference to FIG. 8, in another aspect of the disclosure, a structure 800 for a semiconductor device includes a Cu layer 810 and a Ni alloy layer 801 wth Ni grain sizes $a_1$ and $a_2$, wherein $a_1<a_2$. The structure 800 further includes a Sn layer 820. Sn layer 820 may optionally be comprised of a Sn alloy such as Sn—Ag, Sn—Cu—Ag, Sn—Bi, etc. The Ni alloy layer 801 is between the Cu layer 810 and the Sn layer 820.

In an example, the Ni grains of size $a_1$ within the Ni alloy layer is substantially closer to the Cu layer than the Sn layer, and the Ni grains of size $a_2$ within the Ni alloy layer is substantially closer to the Sn layer than the Cu layer.

In an example, the Ni grain size $a_1$ is between 1 nm and 100 nm in diameter, and the Ni grain size $a_2$ is between 2 nm and 100 nm in diameter.

In an example, the Ni alloy layer comprises at least one element selected from the group consisting of tungsten (W), molybdenum (Mo), an element from a lanthanoid group, and combinations thereof.

In an example, a % by weight ($x_1$) of the at least one element within the Ni alloy layer is present, a % by weight ($x_2$) of the at least one element within the Ni alloy layer is present, and wherein $x_1>x_2$.

In an example, the at least one element at $x_1$ within the Ni alloy layer is substantially closer to the Sn layer than the Cu layer, and the at least one element at $x_2$ within the Ni alloy layer is substantially closer to the Cu layer than the Sn layer.

In an example, some of the at least one element at $x_1$ within the Ni alloy layer and some of the at least one element at $x_2$ within the Ni alloy layer are solubilized in the Ni grains, while a remainder of the at least one element at $x_1$ within the Ni alloy layer and a remainder of the at least one element at $x_2$ within the Ni alloy layer are segregated at boundaries of the Ni grains.

In an example, the Ni alloy layer comprises NiW.

In an example, the Ni alloy layer comprises NiCe, NiLa, NiMo, NiMoW, or NiWCe.

Figure 9:
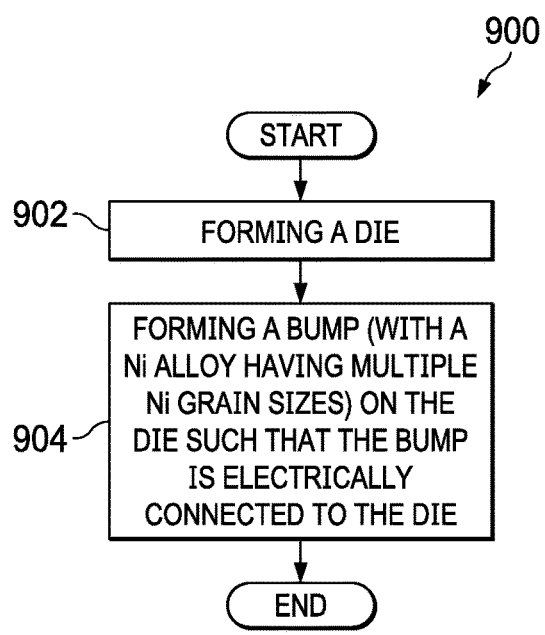
FIG. 9 is a flowchart illustrating an exemplary method for forming another integrated circuit package, in accordance with this disclosure.

With reference to FIG. 9, In yet another aspect of the disclosure, a method 900 of forming an integrated circuit package includes forming a die (block 902) and forming a bump on the die such that the bump is electrically connected to the die (block 904). The forming of the bump includes forming a copper (Cu) layer. The forming of the bump also includes forming a nickel (Ni) alloy layer with Ni grain sizes $a_1$ and $a_2$, wherein $a_1 < a_2$. The forming of the bump further includes forming a tin (Sn) layer, wherein the Ni alloy layer is between the Cu layer and the Sn layer.

In an example of the method, the Ni grains of size $a_1$ within the Ni alloy layer is substantially closer to the Cu layer than the Sn layer, and the Ni grains of size $a_2$ within the Ni alloy layer is substantially closer to the Sn layer than the Cu layer.

In an example of the method, the Ni alloy layer comprises at least one element selected from the group consisting of tungsten (W), molybdenum (Mo), an element from a lanthanoid group, and combinations thereof.

In an example of the method, a % by weight ($x_1$) of the at least one element within the Ni alloy layer is present, a % by weight ($x_2$) of the at least one element within the Ni alloy layer is present, and wherein $x_1 > x_2$.

In an example of the method, the at least one element at $x_1$ within the Ni alloy layer is substantially closer to the Sn layer than the Cu layer, and the at least one element at $x_2$ within the Ni alloy layer is substantially closer to the Cu layer than the Sn layer.

In an example of the method, the forming of the Ni alloy layer comprises heating and melting together of multiple pre-heated Ni alloy layers, prior to the forming of the Sn layer.

Reversed Pulse Plating

Figure 6:
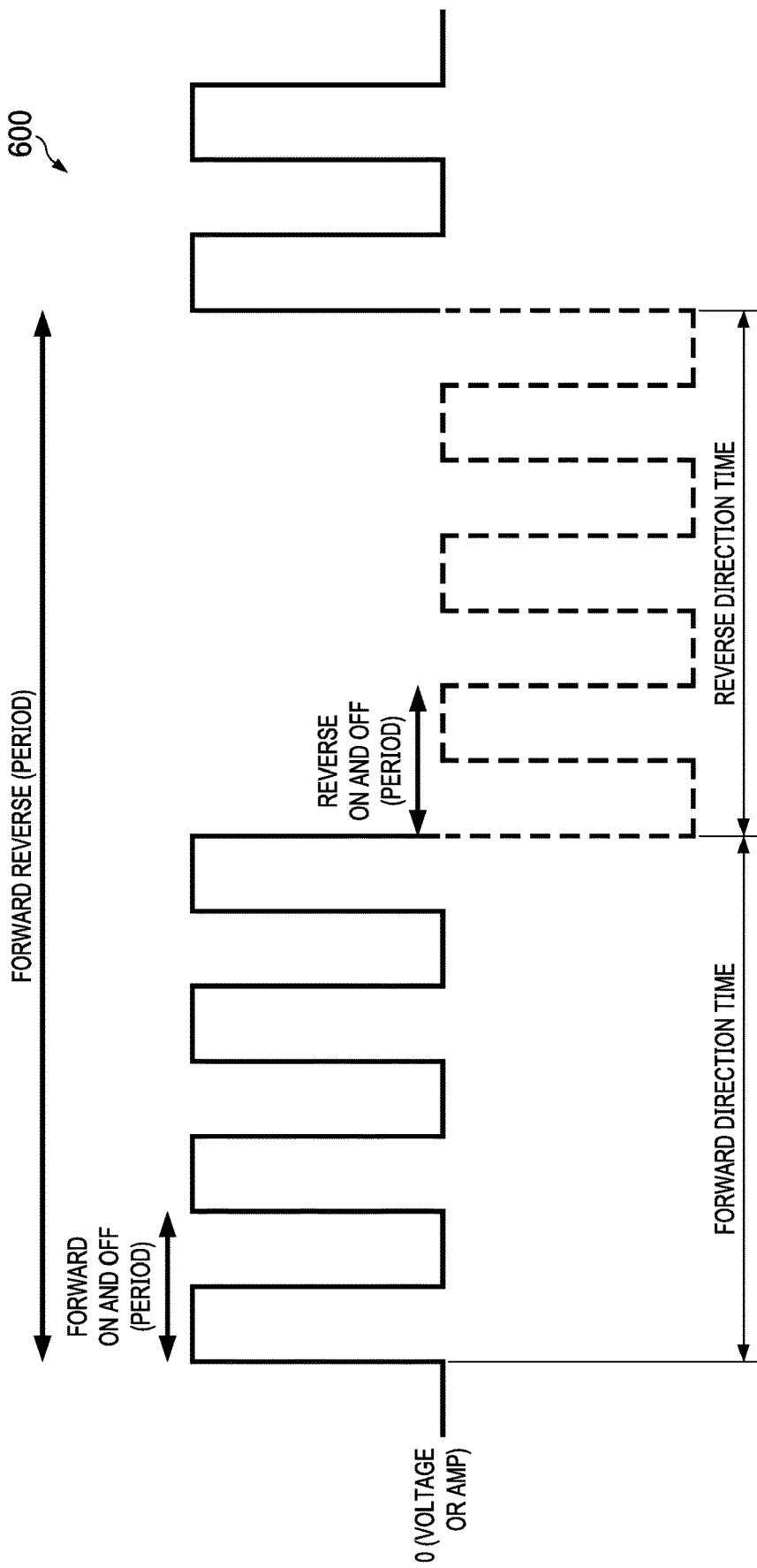
FIG. 6 is a plot depicting an example of a reversed pulse waveform that may be applied to form Ni alloy layers of a structure for a semiconductor device, in accordance with this disclosure.

Examples below describe reverse pulse electrodeposition processes including, inter alia, current density and pulse duration characteristics. In pulse reverse plating (PRP), the potential voltage and/or current is alternated between cathodic and anodic pulses. Cathodic and anodic pulses are characterized by their amplitude (peak voltage and/or peak current density) and pulse duration. Each pulse may consist of an OFF time ($T_{OFF}$) during which the applied current is zero. FIG. 6 is a plot 600 depicting an example of a reversed pulse waveform that may be applied to form Ni alloy layers between Cu and Sn layers in any of the aspects of the disclosure. The combination of the Cu and Sn layers and the intermediary Ni alloy layers form a structure for a semiconductor device. As it can be seen in FIG. 6, each cathodic pulse consists of an ON-time pulse duration ($T_{ON,cathodic}$) during which negative potential and/or negative current is applied, and an OFF-time ($T_{OFF,cathodic}$) during which zero current is applied. Each anodic pulse consists of an ON-time pulse duration ($T_{ON,anodic}$) during which positive potential and/or positive current is applied, and an OFF-time ($T_{OFF,anodic}$) during which zero current is applied.

The deposited film composition (e.g., the content (% by weight) of co-deposited W in electrodeposition of NiW alloys) may be controlled in an atomic order by regulating the pulse amplitude and width, which fosters the initiation of grain nuclei and greatly increases the number of grains per unit area resulting in finer-grained deposit with better properties as compared to direct current (DC) plated coatings.

High current density areas in the bath (i.e., plating solution) become more depleted of ions than low current density areas. During $T_{OFF}$, ions migrate to the depleted areas in the bath. Therefore, during the $T_{ON}$, more evenly distributed ions would be available for electrodeposition.

Table 1 and Table 2 below show an example of the waveform than can be used for depositing of first and second layers of NiW, respectively. The average current density ($I_{Average}$) is calculated using Equation 1.

$$I_{Average} = (I_{Cathodic,ON} \times T_{Cathodic,ON} - I_{Anodic,ON} \times T_{Anodic,ON})/(T_{Cathodic,ON} + T_{Cathodic,OFF} + T_{Anodic,ON} + T_{Anodic,OFF}) \quad \text{(Equation 1)}$$

TABLE 1

Pulse waveform characteristics for depositing of the first layer of NiW.

| Pulse characterization | Symbol | Value |
|---|---|---|
| Cathodic pulse amplitude (current density) | $I_{Cathodic,\,ON}$ | 0.5 A/cm$^2$ |
| Cathodic pulse duration during ON time | $T_{Cathodic,\,ON}$ | 20 ms |
| Cathodic OFF time | $t_{Cathodic,\,OFF}$ | 0 |
| Anodic pulse amplitude (current density) | $I_{Anodic,\,ON}$ | 0.3 A/cm$^2$ |
| Anodic pulse duration during ON time | $T_{Anodic,\,ON}$ | 13 ms |
| Anodic OFF time | $T_{Anodic,\,OFF}$ | 0 |
| Average current density | $I_{Average}$ | 0.185 A/cm$^2$ |

TABLE 2

Pulse waveform characteristics for depositing of the second layer of NiW.

| Pulse characterization | Symbol | Value |
|---|---|---|
| Cathodic pulse amplitude (current density) | $I_{Cathodic,\,ON}$ | 0.5 A/cm$^2$ |
| Cathodic pulse duration during ON time | $T_{Cathodic,\,ON}$ | 20 ms |
| Cathodic OFF time | $t_{Cathodic,\,OFF}$ | 0 |
| Anodic pulse amplitude (current density) | $I_{Anodic,\,ON}$ | 0.4 A/cm$^2$ |
| Anodic pulse duration during ON time | $T_{Anodic,\,ON}$ | 15 ms |
| Anodic OFF time | $T_{Anodic,\,OFF}$ | 0 |
| Average current density | $I_{Average}$ | 0.114 A/cm$^2$ |

Table 3 and Table 4 below show another example of the waveform than can be used for depositing of first and second layers of NiW, respectively. The average current density ($I_{Average}$) is calculated using Equation 1.

TABLE 3

Pulse waveform characteristics for depositing of the first layer of NiW.

| Pulse characterization | Symbol | Value |
|---|---|---|
| Cathodic pulse amplitude (current density) | $I_{Cathodic,\,ON}$ | 0.6 A/cm$^2$ |
| Cathodic pulse duration during ON time | $T_{Cathodic,\,ON}$ | 20 ms |
| Cathodic OFF time | $t_{Cathodic,\,OFF}$ | 1 |
| Anodic pulse amplitude (current density) | $I_{Anodic,\,ON}$ | 0.4 A/cm$^2$ |
| Anodic pulse duration during ON time | $T_{Anodic,\,ON}$ | 13 ms |
| Anodic OFF time | $T_{Anodic,\,OFF}$ | 0.2 |
| Average current density | $I_{Average}$ | 0.199 A/cm$^2$ |

TABLE 4

Pulse waveform characteristics for depositing of the second layer of NiW.

| Pulse characterization | Symbol | Value |
|---|---|---|
| Cathodic pulse amplitude (current density) | $I_{Cathodic, ON}$ | 0.6 A/cm$^2$ |
| Cathodic pulse duration during ON time | $T_{Cathodic, ON}$ | 20 ms |
| Cathodic OFF time | $t_{Cathodic, OFF}$ | 1 |
| Anodic pulse amplitude (current density) | $I_{Anodic, ON}$ | 0.5 A/cm$^2$ |
| Anodic pulse duration during ON time | $T_{Anodic, ON}$ | 13 ms |
| Anodic OFF time | $T_{Anodic, OFF}$ | 0.5 |
| Average current density | $I_{Average}$ | 0.159 A/cm$^2$ |

Advantages of aspects of the disclosure are, for example, better corrosion resistance, better diffusion barrier, precise control of grain size of deposit, better control of the amount of the segregation of alloying element (e.g., W), reasonable cost, and/or easy scale-up from lab scale to production.

Although examples are described above with reference to W as the alloying element within the NiW layers, other alloying elements/compositions such as Ce, La, Mo, MoW, or WCe may alternatively be employed in any of the examples above. Such alternatives are considered to be within the spirit and scope of the disclosure, and may therefore utilize the advantages of the configurations and examples described above.

Also, although examples are described above with reference to structures with two or three Ni alloy layers, structures with more than three Ni alloy layers between the Cu and Sn layers may alternatively be employed in any of the examples above. Such alternatives are considered to be within the spirit and scope of the disclosure, and may therefore utilize the advantages of the configurations and examples described above.

The method steps in any of the embodiments described herein are not restricted to being performed in any particular order. Also, structures mentioned in any of the method embodiments may utilize structures mentioned in any of the device embodiments. Such structures may be described in detail with respect to the device embodiments only but are applicable to any of the method embodiments.

Features in any of the embodiments described in this disclosure may be employed in combination with features in other embodiments described herein, such combinations are considered to be within the spirit and scope of the present invention.

The above discussion is meant to be illustrative of the principles and various example implementations according to this disclosure. Numerous variations and modifications will become apparent to those skilled in the art once the above disclosure is fully appreciated. It is intended that the following claims be interpreted to embrace all such variations and modifications.

What is claimed is:

1. A structure for a semiconductor device, the structure comprising:
   a copper (Cu) layer;
   a first nickel (Ni) alloy layer with a Ni grain size $a_1$;
   a second Ni alloy layer with a Ni grain size $a_2$, wherein $a_1 < a_2$, and wherein the first Ni alloy layer is between the Cu layer and the second Ni alloy layer; and
   a tin (Sn) layer, wherein the second Ni alloy layer is between the first Ni alloy layer and the Sn layer, wherein the first nickel alloy layer and the second nickel alloy layer comprise an element from a lanthanoid group.

2. The structure of claim 1, wherein a % by weight ($x_1$) of the at least one element within the first Ni alloy layer is present, a % by weight ($x_2$) of the at least one element within the second Ni alloy layer is present, and wherein $x_1 > x_2$.

3. The structure of claim 1, wherein the first Ni alloy layer is formed over the Cu layer.

4. The structure of claim 1, wherein the Sn layer is formed over the second Ni alloy layer.

5. The structure of claim 1, wherein some of the at least one element in the first Ni alloy layer and some of the at least one element in the second Ni alloy layer are solubilized in the Ni grains, while a remainder of the at least one element in the first Ni alloy layer and a remainder of the at least one element in the second Ni alloy layer are segregated at boundaries of the Ni grains.

6. The structure of claim 1, wherein the first Ni alloy layer comprises NiW.

7. The structure of claim 1, wherein the second Ni alloy layer comprises NiW.

8. The structure of claim 1, wherein the first Ni alloy layer comprises NiCe, NiLa, NiMo, NiMoW, or NiWCe.

9. The structure of claim 1, wherein the second Ni alloy layer comprises NiCe, NiLa, NiMo, NiMoW, or NiWCe.

10. The structure of claim 1, further comprising a third Ni alloy layer with a Ni grain size $a_3$, formed over the second Ni alloy layer, and the Sn layer is formed over the third Ni alloy layer, wherein $a_1 < a_2 < a_3$.

11. The structure of claim 10, wherein the first Ni alloy layer, the second Ni alloy layer, and the third Ni alloy layer each comprises at least one element selected from the group consisting of tungsten (W), molybdenum (Mo), an element from a lanthanoid group, and combinations thereof; and
   wherein a % by weight ($x_1$) of the at least one element within the first Ni alloy layer is present, a % by weight ($x_2$) of the at least one element within the second Ni alloy layer is present, a % by weight ($x_3$) of the at least one element within the third Ni alloy layer is present, and wherein $x_1 > x_2 > x_3$.

12. An integrated circuit package comprising:
   a die; and
   a bump electrically connected to the die, the bump comprising:
   a copper (Cu) layer;
   a first nickel tungsten (NiW) layer, with a Ni grain size $a_1$, formed over the Cu layer;
   a second NiW layer, with a Ni grain size $a_2$, formed over the first NiW layer;
   a third NiW layer, with a Ni grain size $a_3$, formed over the second NiW layer, wherein $a_1 < a_2 < a_3$; and
   a tin (Sn) layer formed over the third NiW layer, wherein the first NiW layer and the second NiW layer comprise an element from a lanthanoid group.

13. The integrated circuit package of claim 12, wherein a % by weight ($x_1$) of the W within the first NiW layer is present, a % by weight ($x_2$) of the W within the second NiW layer is present, and a % by weight ($x_3$) of the W within the third NiW layer is present, and wherein $x_1 > x_2 > x_3$.

14. The integrated circuit package of claim 12, wherein some W in the first NiW layer, second NiW layer, and third NiW layer is solubilized in the Ni grains, while the remainder of the W in the first NiW layer, second NiW layer, and third NiW layer is segregated at boundaries of the Ni grains.

* * * * *